United States Patent
Kim et al.

(10) Patent No.: US 9,917,250 B2
(45) Date of Patent: Mar. 13, 2018

(54) SWITCHING DEVICE, METHOD OF FABRICATING THE SAME, AND RESISTIVE RANDOM ACCESS MEMORY INCLUDING THE SWITCHING DEVICE AS A SELECTION DEVICE

(71) Applicant: SK hynix Inc., Icheon (KR)

(72) Inventors: Beom Yong Kim, Suwon (KR); Soo Gil Kim, Seongnam (KR); Won Ki Ju, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/206,092

(22) Filed: Jul. 8, 2016

(65) Prior Publication Data

US 2017/0213958 A1    Jul. 27, 2017

(30) Foreign Application Priority Data

Jan. 27, 2016    (KR) ........................ 10-2016-0010338

(51) Int. Cl.
*H01L 45/00*    (2006.01)

(52) U.S. Cl.
CPC ........ *H01L 45/1266* (2013.01); *H01L 45/085* (2013.01); *H01L 45/06* (2013.01); *H01L 45/08* (2013.01); *H01L 45/1253* (2013.01); *H01L 45/145* (2013.01); *H01L 45/1608* (2013.01)

(58) Field of Classification Search
CPC ........ H01L 45/00; H01L 45/04; H01L 45/08; H01L 45/085; H01L 45/1253; H01L 45/1266; H01L 45/145; H01L 45/146; H01L 45/1608; H01L 45/1641
See application file for complete search history.

(56) References Cited

U.S. PATENT DOCUMENTS

| | | | | |
|---|---|---|---|---|
| 8,658,511 | B1* | 2/2014 | Fulgenico | H01L 21/31122 438/238 |
| 2003/0072126 | A1* | 4/2003 | Bhattacharyya | B82Y 10/00 361/311 |
| 2005/0124155 | A1* | 6/2005 | Brooks | H01L 21/76877 438/654 |
| 2008/0158937 | A1* | 7/2008 | Jung | G11C 11/24 365/149 |
| 2012/0236625 | A1* | 9/2012 | Ohba | H01L 27/2436 365/148 |
| 2014/0175356 | A1* | 6/2014 | Wang | H01L 45/1293 257/2 |
| 2014/0301127 | A1* | 10/2014 | Kim | G11C 13/0004 365/148 |
| 2015/0349251 | A1* | 12/2015 | Chang | H01L 45/1233 257/3 |
| 2017/0047513 | A1* | 2/2017 | Rolandi | G11C 13/0014 |
| 2017/0072604 | A1* | 3/2017 | Sjong | B29C 44/12 |
| 2017/0104031 | A1* | 4/2017 | Clark | H01L 27/2427 |

FOREIGN PATENT DOCUMENTS

KR    10-1436748 B1    9/2014

* cited by examiner

*Primary Examiner* — Eduardo A Rodela

(57) ABSTRACT

A switching device includes a first electrode and a second electrode that are disposed over a substrate, and an electrolyte layer disposed between the first electrode and the second electrode and including a porous oxide. The switching device performs threshold switching operation on the basis of oxidation-reduction reactions of metal ions that are provided from the first electrode or the second electrode to the electrolyte layer.

15 Claims, 10 Drawing Sheets

SWITCHING DEVICE, METHOD OF FABRICATING THE SAME, AND RESISTIVE RANDOM ACCESS MEMORY INCLUDING THE SWITCHING DEVICE AS A SELECTION DEVICE

CROSS-REFERENCE TO RELATED APPLICATION

The present application claims priority under 35 U.S.C 119(a) to Korean Patent Application No. 10-2016-0010338, filed on Jan. 27, 2016, which is herein incorporated by reference in its entirety.

BACKGROUND

1. Technical Field

Various embodiments of the present disclosure relate to a semiconductor memory and, more particularly, to a switching device, a method of fabricating the same, and a resistive random access memory including the switching device as a selection device.

2. Related Art

A cross-point memory array structure has been employed in a cell region of a memory device. More specifically, the cross-point memory array structure has been included in memories, such as a Resistive Random Access Memory (ReRAM), a Phase Change Random Access memory (PCRAM), a Magnetic Random Access Memory (MRAM) and so on, as a cell structure having a pillar, the pillar being interposed between electrodes disposed on different planes and intersecting with each other.

Meanwhile, in the cross-point memory array structure, there may be writing errors or reading errors on cell information due to a sneak current that occurs between adjacent cells. In order to suppress these errors, a selection device has been employed in a cell. As the selecting devices, switching devices, such as transistors, diodes, tunnel barrier devices, and ovonic threshold switches, have been suggested.

SUMMARY

According to an embodiment, there is provided a switching device. The switching device includes a first electrode and a second electrode that are disposed over a substrate, and an electrolyte layer disposed between the first electrode and the second electrode, the electrolyte layer including a porous oxide. The switching device performs a threshold switching operation on the basis of oxidation-reduction reaction of metal ions provided from the first electrode or the second electrode to the electrolyte layer.

According to an embodiment, there is provided a switching device. The switching device includes a first electrode, a porous oxide layer and a second electrode that are sequentially disposed over a substrate. One of the first electrode and the second electrode acts as an ion supplying part that provides metal ions to the porous oxide layer. The switching device is turned on as a conductive bridge is generated in the porous oxide layer by reduction of metal atoms from the metal ions when an absolute value of an external voltage applied between the first electrode and the second electrode increases to be greater than or equal to an absolute value of a turn-on threshold voltage. The switching device is turned off from the turned on state due to disconnection of at least a portion of the conductive bridge when the absolute value of the external voltage decreases to be smaller than or equal to an absolute value of a turn-off threshold voltage.

According to an embodiment, there is provided a resistive memory device. The resistive memory device includes a variable resistance device and a selection device that are disposed over a substrate. The selection device comprises a first electrode, a porous oxide layer including metal ions and a second electrode. The selection device performs a threshold switching operation on the basis of oxidation-reduction reaction of the metal ions.

According to an embodiment, there is provided a method of fabricating a switching device. The method includes forming a first electrode layer over a substrate, forming an electrolyte layer including porous oxide over the first electrode layer, forming a second electrode layer over the electrolyte layer and applying heat treatment to the second electrode layer to diffuse metal atoms in the second electrode layer into the electrolyte layer.

BRIEF DESCRIPTION OF THE DRAWINGS

Various embodiments of a present disclosure will become more apparent in view of the attached drawings and accompanying detailed description, in which.

DETAILED DESCRIPTION OF THE EMBODIMENTS

Figure 1:
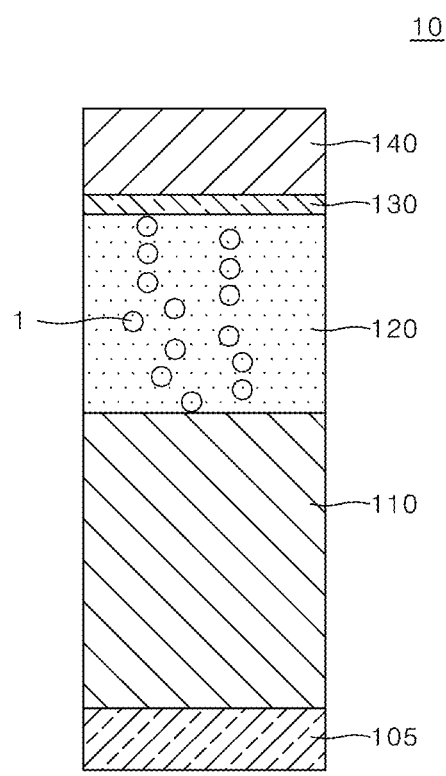
FIG. 1 is a cross-sectional view schematically illustrating a switching device according to an embodiment.

The present disclosure will be described hereinafter with reference to the accompanying drawings, in which embodiments of the present disclosure are shown. In the drawings, the size, widths, and/or thickness of components may be slightly increased in order to clearly express the components of each device. The drawings are described in the observer's point overall, if an element is referred to be located on another element, it may be understood that the element is directly located on the other element, or an additional element may be interposed between the element and the other element. The same reference numerals refer to the same elements throughout the specification.

In addition, expression of the singular form should be understood to include the plural forms unless clearly used otherwise in the context. It will be understood that the terms "comprise" or "have" are intended to specify the presence of a feature, a number, a step, an operation, an element, a part or combinations thereof, but not used to preclude the presence or possibility of addition one or more other features, numbers, steps, operations, components, parts or combinations thereof. In addition, in performing a method or a fabricating method, each step constituting the method may be performed differently from the specified stipulated order as long as a specific sequence is not described apparently in the context. It means that each process may be performed in the same manner as stated order, may be performed substantially at the same time or may be performed in a reverse order.

In accordance with an embodiment of the present disclosure, there may be provided a switching device performing a threshold switching operation. A threshold switching operation of a switching device described in this specification will be understood, in which the switching device sequentially implements a turned-on state and a turned-off state, as described below, when an external voltage applied to the switching device varies.

At first, as an absolute value of the external voltage applied to the switching device gradually increases from an initial state, an operation current of the switching device may be nonlinearly increased after the applied external voltage becomes greater than a predetermined first threshold voltage. In accordance with this phenomenon, the switching device is turned on. After that, as the absolute value of the external voltage applied to the switching device gradually decreases from the turn-on state, the operation current of the switching device may be nonlinearly decreased after the applied external voltage becomes lower than a predetermined second threshold voltage. In accordance with this phenomenon, the switching device is turned off. As such, the switching device performs the threshold switching operation.

FIG. 1 is a cross-sectional view schematically illustrating a switching device 10 according to an embodiment.

Referring to FIG. 1, the switching device 10 includes a first electrode 110, an electrolyte layer 120, and a second electrode 140 that are sequentially disposed on a substrate 105. Additionally, an adhesion layer 130 may be disposed between the electrolyte layer 120 and the second electrode 140. Although not illustrated, an adhesion layer may be additionally disposed between the electrolyte layer 120 and the first electrode 110.

In an embodiment, the substrate 105 may be formed of silicon (Si) or gallium arsenic (GaAs), but embodiments are not limited thereto. In another embodiment, the substrate 105 may be formed of a ceramic, a polymer, or a metal, which can be processed by a semiconductor process. The substrate 105 may include integrated circuits formed therein.

Each of the first electrode 110 and the second electrode 140 may include any of a metal, a conductive metal nitride, and a conductive metal oxide. At least one of the first electrode 110 and the second electrode 140 may function as an ion supplying layer providing metal ions to the electrolyte layer 120. Hereinafter, a case that the second electrode 140 disposed on the electrolyte layer 120 functions as the ion supplying layer will be described as an embodiment.

The first electrode 110 may include a conductive material selected from various metals, metal nitrides, and metal oxides that are employed in fabricating processes of silicon integrated circuits. In an embodiment, the first electrode 110 may include any of a metal such as aluminum (Al), tungsten (W), ruthenium (Ru), or the like, a metal nitride such as titanium nitride (TiN), tantalum nitride (TaN), tungsten nitride (WN), or the like, and a metal oxide such as ruthenium oxide ($RuO_2$), or the like.

The second electrode 140 may include a metal such as aluminum (Al), zinc (Zn), or magnesium (Mg). In an embodiment, the second electrode 140 may include a conductive material selected from various metals, metal nitrides, and metal oxides that are employed in fabricating processes of silicon integrated circuits. In an embodiment, the second electrode 140 may include an aluminum (Al) layer.

The second electrode 140 may be formed of a material having a relatively lower melting point than that of the first electrode 110. Accordingly, a bonding force of metal atoms constituting the second electrode 140 may be relatively weaker than that of metal atoms constituting the first electrode 110. As a result, metal ions 1 may be relatively easily introduced into the electrolyte layer 120 from the second electrode 140 when an external voltage is applied to the switching device 10.

The electrolyte layer 120 may be disposed between the first electrode 110 and the second electrode 140. The electrolyte layer 120 may accept the metal ions 1 introduced from the second electrode 140 when the external voltage is applied to the switching device 10. The metal ion 1 may include an aluminum (Al) ion, a zinc (Zn) ion, or a magnesium (Mg) ion. The metal ion 1 may be an ion of a metal constituting the second electrode 140.

In an embodiment, the metal ions 1 may be introduced into the electrolyte layer 120 before the external voltage is applied to the switching device 10, by diffusing metal atoms constituting the second electrode 140 into the electrolyte layer 120 during a fabricating process that is to be described in connection with FIGS. 3 to 7. Alternatively, as described above, the metal ions 1 may be introduced into the electrolyte layer 120 from the second electrode 140 when the switching device 10 operates by the applied external voltage.

The electrolyte layer 120 may include a material selected from various oxides that are employed to fabricate silicon integrated circuits. The electrolyte layer 120 may include a porous oxide. The porous oxide may include a silicon oxide or an aluminum oxide. In an embodiment, the electrolyte layer 120 may include a porous silicon oxide layer or a porous aluminum oxide layer. The electrolyte layer 120 may include a single silicon oxide layer or a single aluminum oxide layer, or may include a stack structure of two or more of the silicon oxide layer and the aluminum oxide layer. The porous oxide may have an amorphous phase. In addition, the porous oxide may have a composition that does not satisfy the stoichiometric ratio.

The adhesion layer 130 may be employed to increase an interfacial bonding force between the electrolyte layer 120 and the second electrode 140. In an embodiment, the adhesion layer 130 may be a silicon layer. In some other embodiments, the adhesion layer 130 may be disposed between the electrolyte layer 120 and the first electrode 110, or between the electrolyte layer 120 and the second electrode 140, or both.

In the above-described embodiment, the second electrode 140 functions as the ion supplying layer. However, in some other embodiments, the first electrode 110 adjacent to the substrate 105 may function as the ion supplying layer instead of the second electrode 140. In this embodiment, the first electrode 110 may include a metal such as aluminum (Al), zinc (Zn), or magnesium (Mg), and the first electrode 110 may be formed of a material having a lower melting point than that of the second electrode 140.

Figure 2A:
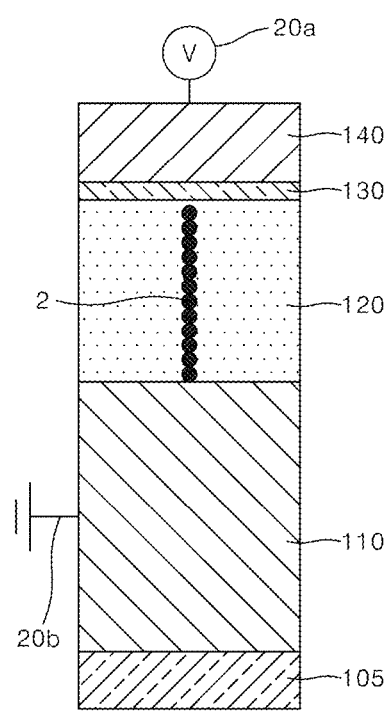
FIGS. 2A and 2B are schematic diagrams illustrating an operating method of a switching device according to an embodiment.
Figure 2B:
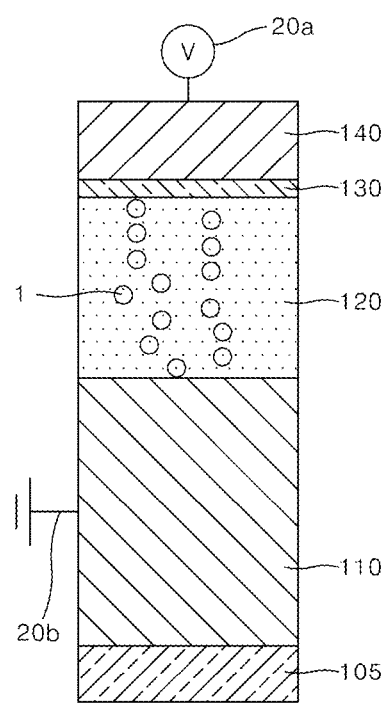

FIGS. 2A and 2B are schematic diagrams illustrating an operating method of a switching device according to an embodiment. FIG. 2A schematically illustrates an internal structure of the switching device in a turn-on state, and FIG. 2B schematically illustrates the internal structure of the switching device whose state is changed from the turn-on state to a turn-off state. Hereinafter, the operating method of the switching device including a first operation mode and a second operation mode will be described using the switching device 10 illustrated in FIG. 1. In this embodiment, the second electrode 140 may function as an ion supplying part providing metal ions into the electrolyte layer 120.

Referring to FIG. 2A, an external voltage is applied between the first electrode 110 and the second electrode 140 of the switching device 10 in an initial state. A power source 20a and a ground line 20b are provided to apply the external voltage to the switching device 10.

In the first operation mode according to an embodiment, a positive bias is applied to the second electrode 140, and a negative bias is applied to the first electrode 110. Alternatively, a positive bias is applied to the second electrode 140, and the first electrode 110 is grounded. While maintaining the polarity of the bias, the external voltage is applied to the switching device 10 so that an absolute value of the applied external voltage gradually increases. Due to the applied external voltage, an electric field is formed in the electrolyte layer 120. Thus, metal ions 1 having positive charges are introduced from the second electrode 140 into the electrolyte layer 120 by the electric field, and the introduced metal ions 1 may be reduced into metal atoms 2 by electrons provided by the first electrode 110. Then, as the absolute value of the applied external voltage gradually increases, the reduced metal atoms 2 may be sequentially arranged from an interface of the electrolyte layer 120 and the first electrode 110 to an inner portion of the electrolyte layer 120.

When the applied external voltage reaches a predetermined first threshold voltage, the arranged metal atoms 2 form a conductive bridge across the electrolyte layer 120, such that the first electrode 110 is electrically coupled to the second electrode 140 via the conductive bridge. When the conductive bridge is formed at a voltage greater than or equal to the first threshold voltage, the operation current of the switching device 10 may be increased nonlinearly. This state may be referred to as a turn-on state in the first operation mode of the switching device 10, and the first threshold voltage may be defined as a turn-on threshold voltage.

After that, the absolute value of the external voltage applied between the first electrode 110 and the second electrode 140 of the switching device 10 in the turn-on state may gradually decrease. When the applied external voltage reaches a predetermined second threshold voltage, the reduced metal atoms 2 are re-oxidized, such that the reduced metal atoms 2 may be emitted into the electrolyte layer 120 in the form of metal ions 1. Accordingly, as illustrated in FIG. 2B, when the applied external voltage becomes smaller than or equal to the second threshold voltage, at least a portion of the conductive bridge is disconnected, and thus the operation current of the switching device 10 may be decreased nonlinearly. This state can be referred to as a turn-off state, and the second threshold voltage can be defined as a turn-off threshold voltage. The turn-off threshold voltage may be smaller than the turn-on threshold voltage. In other embodiments, the turn-off threshold voltage may be equal to the turn-on threshold voltage.

With respect to the re-oxidation of the reduced metal atoms 2, it cannot be explicitly described by a particular theory. According to an example theory, as an external driving force to reduce the metal ion 1 is eliminated, a repulsive force generated between the reduced metal atoms 2 and the oxide of the electrolyte layer 120 is increased, and thus, the re-oxidation of the reduced metal atoms 2 may occur.

In the second operation mode according to an embodiment, a negative bias is applied to the second electrode 140, and a positive bias is applied to the first electrode 110. Alternatively, a negative bias is applied to the second electrode 140, and the first electrode 110 is grounded. While maintaining the polarity of the bias, the external voltage gradually changes such that an absolute value of the applied external voltage increases. Due to the applied external voltage, an electric field is formed in the electrolyte layer 120. Metal ions 1 distributed in the electrolyte layer 120 and electrons provided from the second electrode 140 are combined due to the electric field, and thus, the metal ions 1 may be reduced into metal atoms 2.

As the absolute value of the applied external voltage increases, the reduced metal atoms 2 may be sequentially arranged from the interface of the electrolyte layer 120 and the second electrode 140 to an inner portion of the electrolyte layer 120. When the absolute value of the applied external voltage reaches a predetermined first threshold voltage, the arranged metal atoms 2 form a conductive bridge across the electrolyte layer 120, such that the first electrode 110 is electrically coupled to the second electrode 140 via the conductive bridge. When the conductive bridge is formed while the external voltage has the absolute value that is greater than or equal to that of the first threshold voltage, the operation current of the switching device 10 may be nonlinearly increased. This state may be referred to as a turn-on state in the second operation mode of the switching device 10, and the first threshold voltage may be defined as a turn-on threshold voltage.

After that, the applied external voltage gradually changes, and thus the absolute value of the external voltage applied between the first electrode 110 and the second electrode 140 of the switching device 10 in the turned-on state may gradually decrease. When the absolute value of the applied external voltage reaches a predetermined second threshold voltage, the reduced metal atoms 2 may be re-oxidized, such that the reduced metal atoms 2 may be emitted into the electrolyte layer 120 in the form of metal ions 1. Accordingly, as illustrated in FIG. 2B, when the absolute value of the applied external voltage becomes smaller than or equal to the second threshold voltage, at least a portion of the conductive bridge is disconnected, and the operation current of the switching device 10 may be decreased nonlinearly. This state may be referred to as a turn-off state in the second operation mode of the switching device 10, and the second threshold voltage may be defined as a turn-off threshold voltage. At this time, the absolute value of the turn-off threshold voltage may be smaller than the absolute value of the turn-on threshold voltage. In other embodiments, the turn-off threshold voltage may be equal to the turn-on threshold voltage.

With respect to the re-oxidation of the reduced metal atoms 2, as described above in the first operation mode, the re-oxidation of the reduced metal atoms 2 may occur by the repulsive force generated between the reduced metal atoms 2 and the oxide of the electrolyte layer 120.

In an embodiment, in the first or second operation mode, although the external voltage is not applied between the first electrode 110 and the second electrode 140, metal ions 1 may be distributed in the electrolyte layer 120 in a sufficient density to perform the threshold switching operation. As illustrated in FIGS. 3 to 7, the metal ions 1 may be provided into the electrolyte layer 120 by applying a heat treatment to the second electrode 140 of the switching device 10 such that metal atoms in the second electrode 140 are diffused into the electrolyte layer 120.

The metal ions 1 provided to the electrolyte layer 120 by the heat treatment may react with electrons supplied from the second electrode 140 in the second operation mode, and thus the metal ions 1 may be reduced into the metal atoms 2. That is, even though the second operation mode is performed prior to the first operation mode, the threshold switching operation of the switching device 10 can be normally performed by the metal ions 1 that the heat treatment distributed in the electrolyte layer 120.

In another embodiment, the second operation mode can be performed after the first operation mode is performed at least one time. Accordingly, after the first operation mode is performed, the metal ions 1 emitted into the electrolyte layer 120 may react with electrons provided from the second electrode 140 in the second operation mode, and thus the metal ions 1 may be reduced into the metal atoms 2.

As described above, a switching device according to an embodiment shows a threshold switching characteristic in which its operation current varies nonlinearly as an applied external voltage reaches a turn-on threshold voltage or a turn-off threshold voltage.

Figure 3:
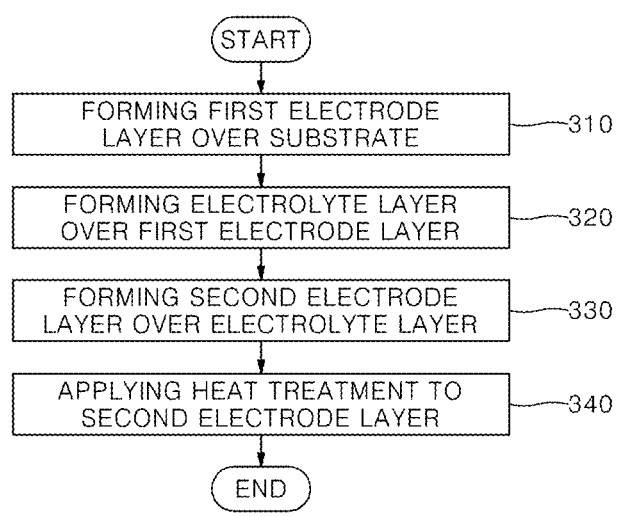
FIG. 3 is a flow chart illustrating a method of fabricating a switching device according to an embodiment.

FIG. 3 is a flow chart schematically illustrating a method of fabricating a switching device according to an embodiment. FIGS. 4 to 7 are cross-sectional views schematically illustrating the method of fabricating the switching device.

Figure 4:
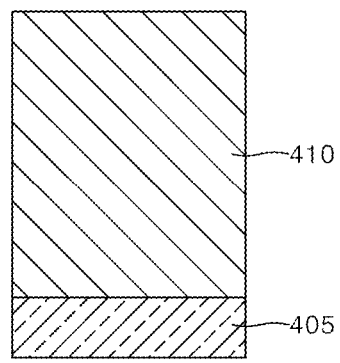
FIGS. 4 to 7 are cross-sectional views illustrating a method of fabricating a switching device according to an embodiment.

Referring to FIGS. 3 and 4, a first electrode layer 410 is formed on a substrate 405 at step 310. The substrate 405 may be formed of silicon (Si), gallium arsenide (GaAs), or the like, but embodiments are not limited thereto. The substrate 405 may be formed of a ceramic, a polymer, or a metal, which can be processed by a semiconductor process. The substrate 405 may include integrated circuits formed therein.

The first electrode layer 410 may include any one of a metal, a conductive nitride, and a conductive oxide. The first electrode layer 410 may include a conductive material selected from various metals, metal nitrides, and metal oxides, which are employed in fabricating processes of silicon integrated circuits.

In an embodiment, the first electrode layer 410 may include any of aluminum (Al), tungsten (W), ruthenium (Ru), titanium nitride (TiN), tantalum nitride (TaN), tungsten nitride (WN), ruthenium oxide ($RuO_2$), and the like. The first electrode layer 410 may include a single layer or a stacked structure of two or more of the above materials. In an embodiment, the first electrode layer 410 may be formed using any of a chemical vapor deposition (CVD) method, a sputtering method, an atomic layer deposition (ALD) method, and the like. The first electrode layer 410 may have a thickness of over about 50 nm.

Figure 5:
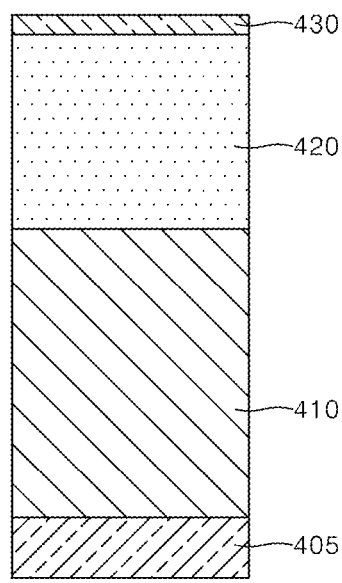

Referring to FIGS. 3 and 5, an electrolyte layer 420 is formed on the first electrode layer 410 at step 320. The electrolyte layer 420 may include a porous silicon oxide layer or a porous aluminum oxide layer. In an embodiment, the electrolyte layer 420 may be formed using a physical vapor deposition (PVD) method or an atomic layer deposition (ALD) method. The process for forming the electrolyte layer 420 may be carried out at a temperature of about 50° C. to about 300° C. The electrolyte layer 420 formed through the above process does not satisfy the stoichiometric ratio, and may include a porous oxide having an amorphous phase. In an embodiment, the electrolyte layer 420 may have a thickness of about 2 nm to about 30 nm.

An adhesion layer 430 may be formed on the electrolyte layer 420. The adhesion layer 430 may increase an interfacial bonding force between the electrolyte layer 420 and a second electrode layer 440 to be formed on the adhesion layer 430. In an embodiment, the adhesion layer 430 may be a silicon layer. In an embodiment, the adhesion layer 430 may be formed using any of a chemical vapor deposition (CVD) method, a sputtering method, an atomic layer deposition (ALD) method, and the like. In an embodiment, the adhesion layer 430 may have a thickness of about 1 nm to about 5 nm. In some other embodiments, the adhesion layer 430 may be omitted.

Figure 6:
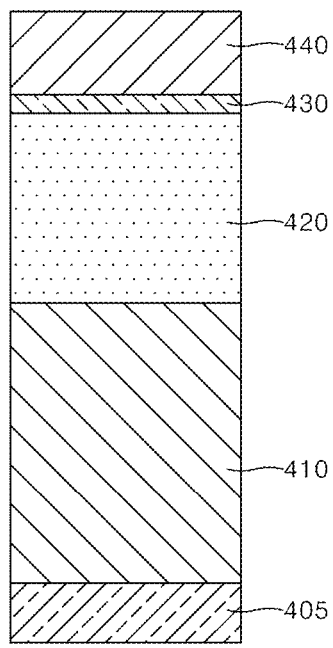

Referring to FIGS. 3 and 6, the second electrode layer 440 is formed over the electrolyte layer 420 at step 330. The second electrode layer 440 may function as an ion supplying layer. The second electrode layer 440 may be formed of a material having a lower melting point than that of the first electrode layer 410. Accordingly, a bonding energy of atoms constituting the second electrode layer 440 may be relatively lower than a bonding energy of atoms constituting the first electrode layer 410. In an embodiment, the second electrode layer 440 may include one of an aluminum (Al) layer, a zinc (Zn) layer, a magnesium (Mg) layer, and a combination thereof. In an embodiment, the second electrode layer 440 may be formed using a physical vapor deposition (PVD) method, a chemical vapor deposition (CVD) method, or an atomic layer deposition (ALD) method. The second electrode layer 440 may have a thickness of about 5 nm to about 20 nm.

Figure 7:
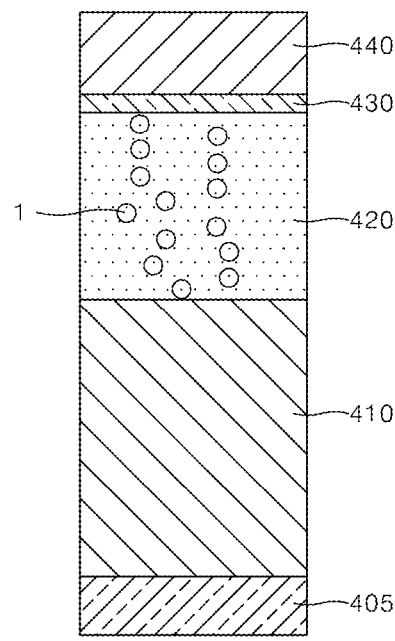

Referring to FIGS. 3 and 7, a heat treatment may be applied to the second electrode layer 440 at step 340. Through the heat treatment, metal atoms in the second electrode layer 440 may be diffused into the electrolyte layer 420. The metal atoms diffused into the electrolyte layer 420 may be accepted into the electrolyte layer 420 in the form of metal ions 1. The heat treatment applied to the second electrode layer 440 may be carried out at a temperature of about 100° C. to about 500° C. The heat treatment may be carried out in an inert gas ambience.

Then, the first electrode layer 410, the electrolyte layer 420, the adhesion layer 430, and the second electrolyte layer 420 are patterned to fabricate the switching device 10 described above with reference to FIGS. 1, 2A, and 2B.

According to an embodiment, the first electrode layer 410, the electrolyte layer 420, the adhesion layer 430, and the second electrode layer 440 may be formed of materials that can be applied to a conventional process of fabricating silicon integrated circuits. In an embodiment, the first electrode layer 410 may be a titanium nitride (TiN) layer, the electrolyte layer 420 may be a porous silicon oxide layer, the adhesion layer 430 may be a silicon (Si) layer, and the second electrode layer 440 may be an aluminum (Al) layer.

Meanwhile, in some other embodiments, the heat treatment may be omitted. In this embodiment, metal ions may be supplied into an electrolyte layer by applying an external voltage to a switching device in a first operation mode, as described above with reference to FIGS. 1, 2A, and 2B.

As described above, in the method of fabricating the switching device according to the embodiment, structural reliability of the switching device with respect to a material may be achieved by employing materials that can be applied to a conventional process of fabricating silicon integrated circuits. In addition, since the conventional process of fabricating the silicon integrated circuits is reliable, it is possible to improve the productivity in fabrication of the switching device.

Figure 8:
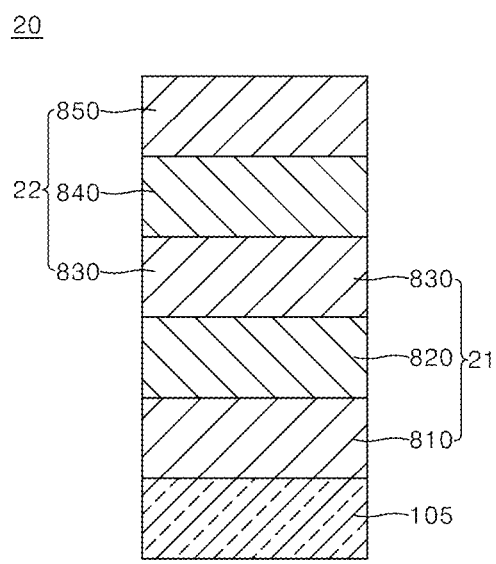
FIG. 8 is a cross-sectional view illustrating a resistive memory device according to an embodiment.

FIG. 8 is a cross-sectional view schematically illustrating a resistive memory device 20 according to an embodiment.

Referring to FIG. 8, the resistive memory device 20 includes a variable resistance device 21 and a selection device 22 that are disposed on a substrate 105. The variable resistance device 21 includes a first memory electrode 810, a resistance change memory layer 820, and a second memory electrode 830 that are sequentially disposed on the substrate 105. The variable resistance device 21 may have a memory characteristic in which resistance of the device 21 varies depending on an external voltage applied thereto and the varied resistance is stored in the device 21 when the applied external voltage is eliminated. In an embodiment, the variable resistance device 21 may be included in a memory cell of a random access memory (RRAM), a phase change random access memory (PRAM), or a magnetic random access memory (MRAM).

Each of the first memory electrode 810 and the second memory electrode 830 may include a metal, a conductive nitride, a conductive oxide, or the like. In an embodiment, each of the first memory electrode 810 and the second memory electrode 830 may include any of gold (Au), platinum (Pt), copper (Cu), silver (Ag), ruthenium (Ru), titanium (Ti), iridium (Ir), tungsten (W), titanium nitride (TiN), tantalum nitride (TaN), and a combination thereof.

In an embodiment, the resistance change memory layer 820 may include a metal oxide such as a titanium oxide ($TiO_{2-x}$), an aluminum oxide ($Al_2O_3$), a nickel oxide ($NiO_x$), a copper oxide ($Cu_xO$), a zirconium oxide ($ZrO_2$), a manganese oxide ($MnO_2$), a hafnium oxide ($HfO_2$), a tungsten oxide ($WO_3$), a tantalum oxide ($Ta_2O_{5-x}$), a niobium oxide ($Nb_2O_5$), an iron oxide ($Fe_3O_4$), or the like. In another embodiment, the resistance change memory layer 820 may include a perovskite material such as PCMO ($Pr_{0.7}Ca_{0.3}MnO_3$), LCMO($La_{1-x}Ca_xMnO_3$), BSCFO ($Ba_{0.5}Sr_{0.5}Co_{0.8}Fe_{0.2}O_{3-\delta}$), YBCO($YBa_2Cu_3O_{7-x}$), (Ba,Sr)$TiO_3$(Cr, Nb-doped), $SrZrO_3$(Cr,V-doped), (La, Sr)$MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, or the like. In still another embodiment, the resistance change memory layer 820 may include a material of a selenide series such as $Ge_xSe_{1-x}$(Ag,Cu,Te-doped), or a metal sulfide such as $Ag_2S$, $Cu_2S$, CdS, ZnS, or the like.

The selection device 22 includes a first electrode 830, a porous oxide layer 840, and a second electrode 850. The first electrode 830 may be the second memory electrode 830 of the variable resistance device 21. However, in some other embodiments, another electrode may be disposed on the second memory electrode 830 of the variable resistance device 21, and may be used as a first electrode of the selection device 22.

The selection device 22 may have substantially the same configuration as the switching device 10 of the embodiment described above with reference to FIGS. 1, 2A, and 2B. In this embodiment, the porous oxide layer 840 may correspond to the electrolyte layer 120 of the switching device 10. The porous oxide layer 840 may accept metal ions provided from an ion supplying layer that is one of the first electrode 830 and the second electrode 850. When an external voltage is applied to the selection device 22, a conductive bridge is generated or disconnected in the porous oxide layer 840 due to oxidation or reduction of the metal ions accepted by the porous oxide layer 840, and thus the selection device 22 may perform a threshold switching operation. Although it is not illustrated, an adhesion layer may be disposed between the porous oxide layer 840 and the second electrode 850, between the porous oxide layer 840 and the first electrode 830, or both.

The resistive memory device 20 includes a structure in which the variable resistance device 21 and the selection device 22 are sequentially stacked on the substrate 105. In another embodiment, the selection device 22 and the variable resistance device 21 may be sequentially stacked on the substrate 105. That is, the selection device 22 is disposed between the variable resistance device 21 and the substrate 105. In this embodiment, the second electrode of the selection device 22 may be the first memory electrode of the variable resistance device 21.

In a fabricating method of the resistive memory device 20, the layers for the variable resistance device and the layers for the selection device are formed on the substrate, and then the layers are patterned. As a result, the resistive memory device 20 including the variable resistance device 21 and the selection device 22 of FIG. 8 may be manufactured on the substrate 105.

The layers for the variable resistance device may be formed using any of a known chemical vapor deposition (CVD) method, a sputtering method, an atomic layer deposition (ALD) method, and the like. Also, the layers for the selection device may be formed using the method described above with reference to FIGS. 3 to 7.

Figure 9:
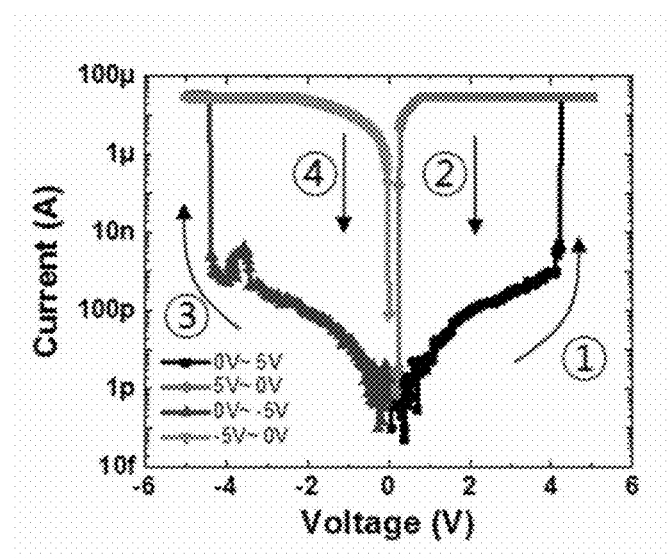
FIG. 9 is a current-voltage (I-V) graph illustrating operational characteristics of a switching device according to an embodiment.

FIG. 9 is a current-voltage (I-V) graph illustrating operational characteristics of a switching device according to an embodiment. The current-voltage (I-V) graph was obtained by performing the following experiment.

A titanium nitride (TiN) layer was formed on an insulative substrate as a first electrode layer using a sputtering method, and had a thickness of about 100 nm. A silicon oxide ($SiO_2$) layer was formed as an electrolyte layer, and had a thickness of about 30 nm. The silicon oxide ($SiO_2$) layer was formed using an ALD method at a temperature of about 300° C. A silicon (Si) layer was formed on the silicon oxide ($SiO_2$) layer as an adhesion layer in a thickness of about 5 nm. The silicon (Si) layer was formed using the ALD method. An aluminum (Al) layer was formed on the silicon (Si) layer as a second electrode layer. The aluminum (Al) layer functioned as an ion supplying layer. The aluminum (Al) layer was formed in a thickness of about 5 nm. After that, the titanium nitride (TiN) layer, the silicon oxide ($SiO_2$) layer, the silicon (Si) layer, and the aluminum (Al) layer were patterned to fabricate the switching device.

In a first operation mode of the switching device, a positive external voltage was applied to the second electrode, and the first electrode was grounded. The external voltage applied to the second electrode gradually varied in a range of 0 V to 5 V. An operation current of the switching device was measured while the external voltage varied. At this time, a compliance current, i.e., an upper limit of the operation current, was limited to 30 μA. After the switching device was turned on by the external voltage in the range of 0 V to 5 V, the operation current of the switching device was measured while the external voltage decreased from the turned-on state.

In addition, in a second operation mode of the switching device, a negative external voltage was applied to the second electrode, the first electrode was grounded, and the external voltage gradually varied in a rage of 0 V to −5 V. The operation current of the switching device was measured while the external voltage varied. At this time, the compliance current was limited to 30 μA. After the switching device was turned on by the applied external voltage in the range of 0 V to −5 V, the operation current of the switching device was measured while an absolute value of the external voltage decreased from the turned-on state.

Referring to FIG. 9, reference numerals ① and ② show current-voltage graphs in the first operation mode, and reference numerals ③ and ④ show current-voltage graphs in the second operation mode.

In the first operation mode, as the external voltage increased, the operation current rapidly increased when the applied external voltage reached 4 V, and it means that 4 V is a turn-on threshold voltage. Also, as the applied external voltage decreased from the turn-on threshold voltage, the operation current rapidly decreased when the applied external voltage reached 0.3 V, and therefore, it means that 0.3 V is a turn-off threshold voltage.

In the second operation mode, as an absolute value of the external voltage increased, the operation current rapidly increased when the external voltage reached −4.2 V, and therefore, −4.2 V becomes a turn-on threshold voltage. Also, as the absolute value of the external voltage decreased from the turn-on threshold voltage, the operation current rapidly decreased when the external voltage reached −0.3 V, therefore, −0.3 V becomes a turn-off threshold voltage. As such, the switching device of the embodiment can be found to represent a threshold switching characteristic in both of the first and second operation modes.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A switching device comprising:
a first electrode and a second electrode that are disposed over a substrate;
an electrolyte layer disposed between the first electrode and the second electrode, the electrolyte layer including a porous oxide layer, and
at least one adhesion layer disposed between the electrolyte layer and the first electrode, between the electrolyte layer and the second electrode, or both,
wherein at least one of the first electrode and the second electrode acts as an ion supplying part that provides metal ions to the porous oxide layer,
wherein the at least one adhesion layer is disposed between the one or more ion supplying parts and the porous oxide layer,
wherein the switching device performs a threshold switching operation on the basis of oxidation-reduction reactions of metal ions provided from the first electrode or the second electrode to the electrolyte layer,
wherein the switching device is turned on when an absolute value of a varying external voltage applied between the first electrode and the second electrode increases to be greater than or equal to an absolute value of a turn-on threshold voltage,
wherein the switching device is turned off from the turned-on state when the absolute value of the varying external voltage applied between the first electrode and the second electrode decreases to be smaller than or equal to an absolute value of a turn-off threshold voltage, and
wherein the turn-on state corresponds to a low resistance state, and the turn-off state corresponds to a high resistance state.

2. The switching device of claim 1,
wherein the porous oxide layer comprises a porous silicon oxide layer or a porous aluminum oxide layer, and
wherein the metal ion comprises any one of an aluminum ion, a zinc ion, and a magnesium ion.

3. The switching device of claim 1, wherein the absolute value of the turn-off threshold voltage is smaller than the absolute value of the turn-on threshold voltage.

4. The switching device of claim 1, wherein the absolute value of the turn-off threshold voltage is equal to the absolute value of the turn-on threshold voltage.

5. The switching device of claim 1,
wherein the switching device is turned on by generation of a conductive bridge in the electrolyte layer when the absolute value of the varying external voltage is greater than or equal to the absolute value of the turn-on threshold voltage, and
wherein the switching device is turned off by a disconnection of at least a portion of the conductive bridge when the absolute value of the varying external voltage is smaller than or equal to the absolute value of the turn-off threshold voltage.

6. The switching device of claim 5,
wherein the conductive bridge is generated in the electrolyte layer by the reduction of metal atoms from the metal ions, and
wherein the conductive bridge is disconnected due to the oxidation of the metal atoms into the metal ions.

7. A switching device comprising:
a first electrode, an electrolyte layer, and a second electrode that are sequentially disposed over a substrate, the electrolyte layer including a porous oxide layer, and
an adhesion layer,
wherein one of the first electrode and the second electrode acts as an ion supplying part that provides metal ions to the porous oxide layer,
wherein the adhesion layer is disposed between the porous oxide layer and the ion supplying part,
wherein the switching device is turned on as a conductive bridge is generated in the porous oxide layer by reduction of metal atoms from the metal ions when an absolute value of a varying external voltage applied between the first electrode and the second electrode increases to be greater than or equal to an absolute value of a turn-on threshold voltage, and
wherein the switching device is turned off from the turned-on state due to disconnection of at least a portion of the conductive bridge when the absolute value of the varying external voltage decreases to be smaller than or equal to an absolute value of a turn-off threshold voltage.

8. The switching device of claim 7,
wherein the porous oxide layer comprises a porous silicon oxide layer or a porous aluminum oxide layer, and
wherein the ion supplying part comprises any one of an aluminum layer, a magnesium layer, and a zinc layer.

9. A method of fabricating a switching device, the method comprising:
forming a first electrode layer over a substrate;
forming an electrolyte layer including a porous oxide layer over the first electrode layer;
forming a second electrode layer over the electrolyte layer;
applying heat treatment to the second electrode layer to diffuse metal atoms in the second electrode layer into the electrolyte layer, and
wherein the method further comprises forming an adhesion layer between the electrolyte layer and the second electrode layer, the adhesion layer including a silicon layer,
wherein the switching device is turned on when an absolute value of a varying external voltage applied between the first electrode layer and the second electrode layer increases to be greater than or equal to an absolute value of a turn-on threshold voltage,
wherein the switching device is turned off from the turned-on state when the absolute value of the varying external voltage applied between the first electrode layer and the second electrode layer decreases to be smaller than or equal to an absolute value of a turn-off threshold voltage, and
wherein the turn-on state corresponds to a low resistance state, and the turn-off state corresponds to a high resistance state.

10. The method of claim 9, wherein the first electrode layer comprises any one of a metal, a conductive nitride, and a conductive oxide.

11. The method of claim 9, wherein forming the electrolyte layer comprises forming a porous silicon oxide layer or a porous aluminum oxide layer over the first electrode layer.

12. The method of claim 9, wherein forming the electrolyte layer is performed using a physical vapor deposition (PVD) or an atomic layer deposition (ALD) at a temperature of about 50° C. to about 300° C.

13. The method of claim 9, wherein forming the second electrode layer is performed using any one of a physical vapor deposition (PVD), a chemical vapor deposition (CVD), and an atomic layer deposition (ALD).

14. The method of claim 9, wherein forming the second electrode layer comprises forming any one of an aluminum layer, a zinc layer, and a magnesium layer.

15. The method of claim 9, wherein applying the heat treatment to the second electrode layer is performed at a temperature of about 100° C. to about 500° C. in an inert gas ambience.

* * * * *